(12) United States Patent
Mountain

(10) Patent No.: US 11,138,500 B1
(45) Date of Patent: Oct. 5, 2021

(54) GENERAL PURPOSE NEURAL PROCESSOR

(71) Applicant: The Government of the United States as represented by the Director, National Security Agency, Ft. George G. Meade, MD (US)

(72) Inventor: David J. Mountain, Baltimore, MD (US)

(73) Assignee: U.S. Government as represented by the Director, National Security Agency, Washington, DC (US)

( * ) Notice: Subject to any disclaimer, the term of this patent is extended or adjusted under 35 U.S.C. 154(b) by 351 days.

(21) Appl. No.: 16/293,020

(22) Filed: Mar. 5, 2019

Related U.S. Application Data

(60) Provisional application No. 62/639,014, filed on Mar. 6, 2018.

(51) Int. Cl.
*G06N 3/063* (2006.01)
*G11C 13/00* (2006.01)
*G06N 3/08* (2006.01)
*H03K 5/24* (2006.01)
*H03F 3/45* (2006.01)

(52) U.S. Cl.
CPC ........... *G06N 3/0635* (2013.01); *G06N 3/084* (2013.01); *G11C 13/0069* (2013.01); *H03F 3/45269* (2013.01); *H03K 5/2481* (2013.01)

(58) Field of Classification Search
CPC ...... G06N 3/0635; G06N 3/084; G06N 3/063; G11C 13/0069; H03K 5/2481; H03F 3/45269
See application file for complete search history.

(56) References Cited

U.S. PATENT DOCUMENTS 9,015,094 B2 * 4/2015 Suri ..................... G06N 3/049
706/26

* cited by examiner

*Primary Examiner* — Jung Kim

(57) ABSTRACT

A computer processor includes an on-chip network and a plurality of tiles. Each tile includes an input circuit to receive a voltage signal from the network, and a crossbar array, including at least one neuron. The neuron includes first and second bit lines, a programmable resistor connecting the voltage signal to the first bit line, and a comparator to receive inputs from the two bit lines and to output a voltage, when a bypass condition is not active. Each tile includes a programming circuit to set a resistance value of the resistor, a pass-through circuit to provide the voltage signal to an input circuit of a first additional tile, when a pass-through condition is active, a bypass circuit to provide values of the bit lines to a second additional tile, when the bypass condition is active; and at least one output circuit to provide an output signal to the network.

4 Claims, 17 Drawing Sheets

GENERAL PURPOSE NEURAL PROCESSOR

CROSS REFERENCE TO RELATED APPLICATIONS

This application claims priority to provisional patent application Ser. No. 62/639,014, filed Mar. 6, 2018, titled "General Purpose Neural Processor," the contents of which are hereby incorporated by reference herein in their entirety.

FIELD OF INVENTION

The present invention relates, in general, to computer processors and, in particular, to processors for neuromorphic computing implemented with programmable resistors.

BACKGROUND

As a result of more than 50 years of technological advancement exemplified by Moore's Law and Dennard scaling, computers have become a ubiquitous feature of modern life. In contrast to their original use for tasks requiring precise scientific calculations, today computers are used for an incredible variety of applications, including social media, pictures and video, and speech processing. A smartphone, available for $500 or less, is expected to be capable of "computing" in a multitude of ways. Extensive use of cognitive computing is anticipated.

These new and emerging applications do not optimally map themselves to traditional computing paradigms developed for very precise scientific calculations. In the existing paradigm, a pre-defined algorithm, implemented using a computer language that completely specifies the sequence of calculations to be performed, is used. However, this approach is less than optimal when the algorithm is not precisely specified and therefore the exact set of calculations are not known. For these newer applications, researchers are looking to the human brain for inspiration, an area of exploration that is termed neuromorphic computing (NMC). The understanding of how our brains adapt and adjust to the environment has led to significant growth in the use of artificial neural nets for these emerging applications.

These approaches take advantage of the availability of large amounts of data to "train" the computer to learn the correct answer, as opposed to programming the computer to calculate the correct answer. One of the more popular approaches uses neural networks. This approach is inspired by the functionality of neurons in the brain. FIG. 1 depicts the mathematical operation of a neuron 101 in this approach. Each input 102 to the neuron 101 is weighted 103, which provides a mechanism for assigning levels of importance to the inputs. The weighted inputs are then summed 104 and evaluated 105. A typical evaluation function is shown, where the output equals "1" if the value of the multiply-accumulate (MACC) operation exceeds a threshold. Another term for this design is a Threshold Gate Network (TGN). A large number of these neurons can be connected in a hierarchy, which enables the neural net to abstract information from the provided data. These deep neural nets have proven to be very effective, particularly in the area of image classification.

Because the nature of programming computers for these new applications is significantly altered, traditional computer architectures are not optimal for implementing neural nets or other new models of computing. The traditional von Neumann architecture contains both the program and data stored in a memory that is separate from the processor. Even for scientific calculations, the time and energy cost of moving the data to the processor, the "von Neumann bottleneck" or "memory wall", is well-known. Over time, a variety of novel processor-in-memory architectures have been proposed as solutions to this problem. Neural nets, where the memory (weights) and processing (MACC plus evaluation) are highly integrated, would benefit from novel architectures as well.

Even within the context of traditional models of computing, there are a variety of computer architectures available. The widely used central processing unit (CPU), as typified by Intel's x86 family, is the most common. For more specialized applications such as gaming and film editing, graphics processing units (GPUs) have proven to be highly effective. GPUs trade off more limited functionality with impressive performance for these applications. Field Programmable Gate Arrays (FPGAs) are used by many in the scientific and engineering fields, where the flexibility and performance of programming at the micro-architectural level is a benefit that outweighs the much more complex programming needed. Finally, Application Specific Integrated Circuits (ASICs) provide the ultimate in performance, but the high cost of fabrication and extreme specialization in capabilities relegate this approach to only a few applications. Even within these groupings, a range of concepts, enabled by new technologies or innovative ideas, are possible. Analog vs. digital computation is one example of these possibilities.

In the neuromorphic computing community, an open question is the design of optimal architectures for implementing neural nets. Because the computing industry has mostly focused on optimizing architectures and technologies for von Neumann architectures and scientific applications, the opportunity for innovation and optimization in neural processors is high. It would be very valuable if a general purpose neural net architecture was available. Since much of the neural net research has been focused on image processing or related applications, it is not clear that architectures defined for them are sufficiently general purpose. Microprocessors are designed for good processing capability across a wide range of applications; a general purpose neural processor should also provide this capability.

Neuromorphic computing is based on applying techniques abstracted from neuroscience, in particular approaches implemented as artificial neural nets. Memristor technology, which is being explored as a possible replacement for current memories, is a promising candidate for neuromorphic architectures. These architectures typically take the form of a crossbar array, which is expected to efficiently implement the MACC function depicted in FIG. 1. Components of these architectures include the specific memristor technology employed, the circuit design used for the evaluation function, the on-chip network, and the choice of memristor programming approaches.

Neural nets are a specific implementation of neuromorphic computing. A standard neural network (NN) consists of many simple, connected processors called neurons, each producing a sequence of real-valued activations. Input neurons get activated through sensors perceiving the environment, other neurons get activated through weighted connections from previously active neurons. Some neurons may influence the environment by triggering actions. Learning or credit assignment is about finding weights that make the NN exhibit desired behavior, such as driving a car. Depending on the problem and how the neurons are connected, such behavior may require long causal chains of computational stages, where each stage transforms (often in a non-linear way) the aggregate activation of the network. Deep Learning is about accurately assigning credit across many such stages. This deeper hierarchy of features tends to make classification more stable.

Neural nets have been shown to be very useful for a variety of image recognition/image processing applications. They have also been shown to be useful in malware analysis, and the use of deep neural nets (typified by artificial neural nets, spiking neural nets, recurrent neural nets, and convolutional neural nets) for applications is increasing rapidly. For example, AlphaGo is a deep neural net trained to play the board game Go, which recently defeated a world class expert. Useful neural nets can range in size from very small (a few hundred neurons), to very large (hundreds of thousands of neurons). They can also have very few layers of connected neurons (2-5) to very many (up to 100 have been trained). The AlphaGo neural net has 15 layers of neurons, where the input layer is a 19×19×48 three-dimensional tensor; the Go game is on a 19×19 grid, and 48 specific features are used to represent the board and the game situation at any given time. Algorithms used to assign the weights of the neural network are called learning algorithms that "train" the network. Backpropagation is one such learning algorithm. Training is an extremely computationally intense process. AlphaGo used 50 GPUs and required 1 day to play 1 million Go games as part of its training process. Using the neural net to perform its trained task is called inference. This is much less computationally demanding.

In 1971, Leon Chua published a paper hypothesizing the existence of a fourth basic circuit element, which he called a memristor (a resistor with memory). He reasoned that a fourth circuit element should exist in order to complete basic linear relationships between the four state variables (V, I, Q, and flux). Chua described the basic current-voltage relationship for a memristor as:

$$I=G(X,V,t)*V$$

where G is the device conductance, and is dependent on a state variable X.

$$dX/dt=f(X,V,t)$$

The rate of change of X is dependent upon the current value of X and other inputs. It is the interplay of G and dX/dt that gives the memristor its unique properties.

SUMMARY

One embodiment of the present invention is a computer processor including an on-chip network and a plurality of tiles. Each tile includes at least one input circuit configured to receive at least one voltage signal provided by the on-chip network. Each tile also includes a crossbar array having at least one neuron. The neuron includes a first bit line, a second bit line, a programmable resistor connecting the voltage signal to the first bit line, and a comparator configured to receive inputs from the two bit lines and to output a voltage, in the event a bypass condition is not active. Each tile also includes a programming circuit configured to set a resistance value of the programmable resistor and a pass-through circuit configured to provide the voltage signal to at least one input circuit of a first additional tile in the processor, in the event a pass-through condition is active. Each tile also includes a bypass circuit configured to provide the value of the bit line to a second additional tile in the processor, in the event the bypass condition is active. Each tile also includes at least one output circuit configured to provide an output signal to the on-chip network.

In a related embodiment, the at least one neuron further includes a programmable resistor connecting the voltage signal to the second bit line. The programming circuit is further configured to set a resistance value of the programmable resistor connecting the voltage signal to the second bit line.

In a further related embodiment, the first additional tile in the processor and the second additional tile in the processor are different tiles.

In a further related embodiment, the first additional tile in the processor and the second additional tile in the processor are the same tile.

Another embodiment of the present invention is a computer processor including a comparator. The comparator includes an input stage having a first input line, a second input line, and a first input calibration line. The first input calibration line includes a transistor and a programmable resistor and is configured to add current to the first input line. The comparator also includes a second input calibration line including a transistor and a programmable resistor and is configured to add current to the second input line. The comparator also includes a first output calibration line including a transistor and a programmable resistor and configured to drain current from the first input line. The comparator also includes a second output calibration line including a transistor and a programmable resistor and configured to drain current from the second input line. The comparator also includes a first plurality of input circuits configured to receive current from the first input line. A voltage operating range across the first plurality of input circuits is configurable by selecting a subset of the first plurality of input circuits to be activated. The comparator also includes a second plurality of input circuits configured to receive current from the second input line. A voltage operating range across the second plurality of input circuits is configurable by selecting a subset of the second plurality of input circuits to be activated. In a related embodiment, the comparator also includes an amplifier stage, electrically coupled to the input stage and, an output stage, electrically coupled to the amplifier stage.

DETAILED DESCRIPTION

Definitions: The term "memristor" refers to an electrical component whose resistance can be increased or decreased in a controllable fashion by modifying voltage/current inputs.

Tiled Arrays

The variety of applications known in the art of neuromorphic computing call for a variety of crossbar array sizes for efficient mapping of neural nets onto the hardware. Finding a single array size that can fit this variety, desirable for a general purpose neural processor, is problematic. Tiled arrays may be used to overcome this limitation, as discussed in detail below. A tile can be a complete array (when small arrays are efficient), and they can also be combined to create much larger arrays, which are necessary for certain neural networks. This novel contribution can be used as a key component of a general purpose neural processor.

Comparator Design

The tiled array architecture is made effective by the use of a 1/High Z neuron architecture, and the design of a compact, power efficient, fast comparator. Many memristor-based neural nets use a very fast, but large and power hungry analog-to-digital converter (ADC) for neuron evaluation. This would be a problematic approach for the tiled array concept. A comparator design is described herein that can efficiently support small tiles.

Architecture and Key Components

Figure 1:
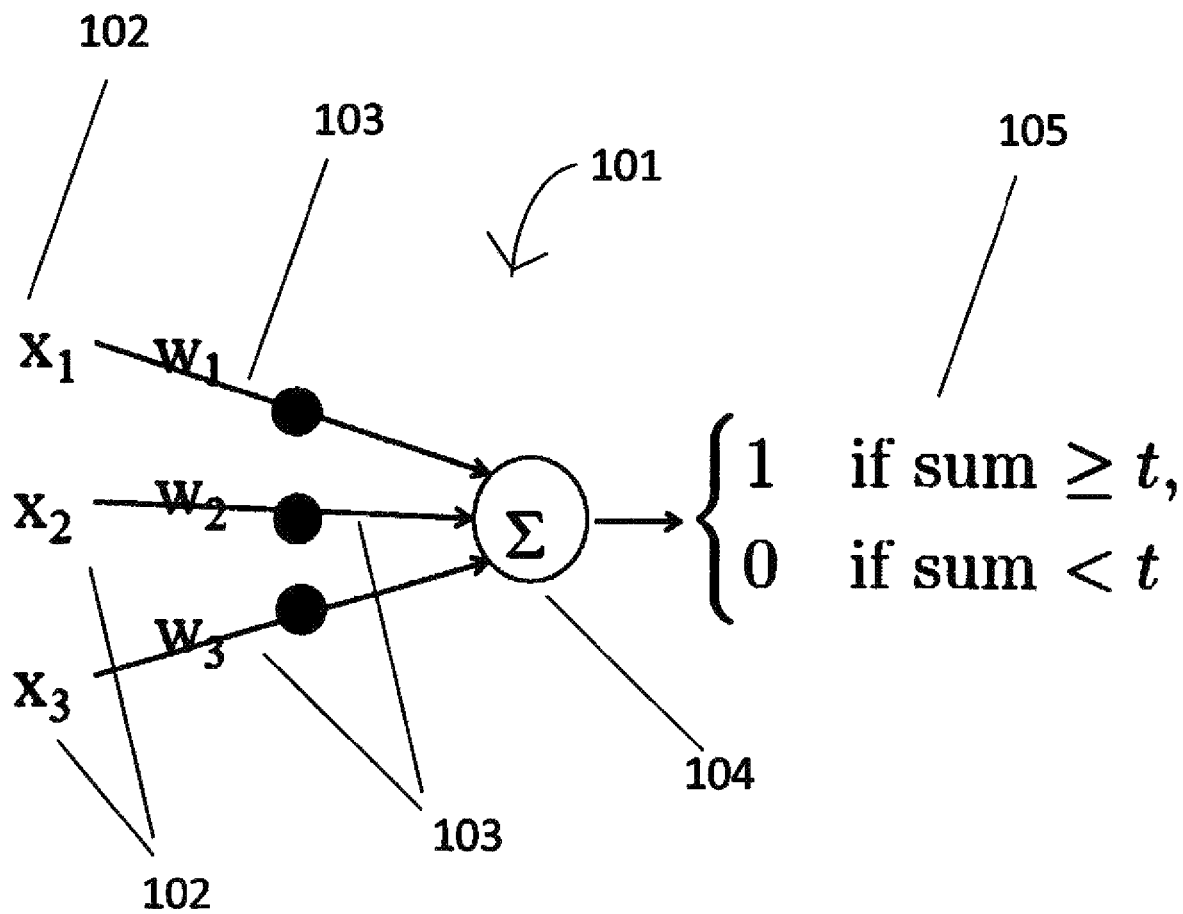
FIG. 1 is a diagram of a neuron in a neuromorphic computing architecture.

Because of their programmable conductance capability, memristors can function as dynamic weights in neuromorphic computing designs. Referencing FIG. 1, memristors can be programmed as the weights ($w_i$) applied to the inputs ($x_i$). Since the programming process can be controlled using feedback from the output, it is possible for memristor-based designs to be modified during operation, integrating learning into the system.

Figure 2:
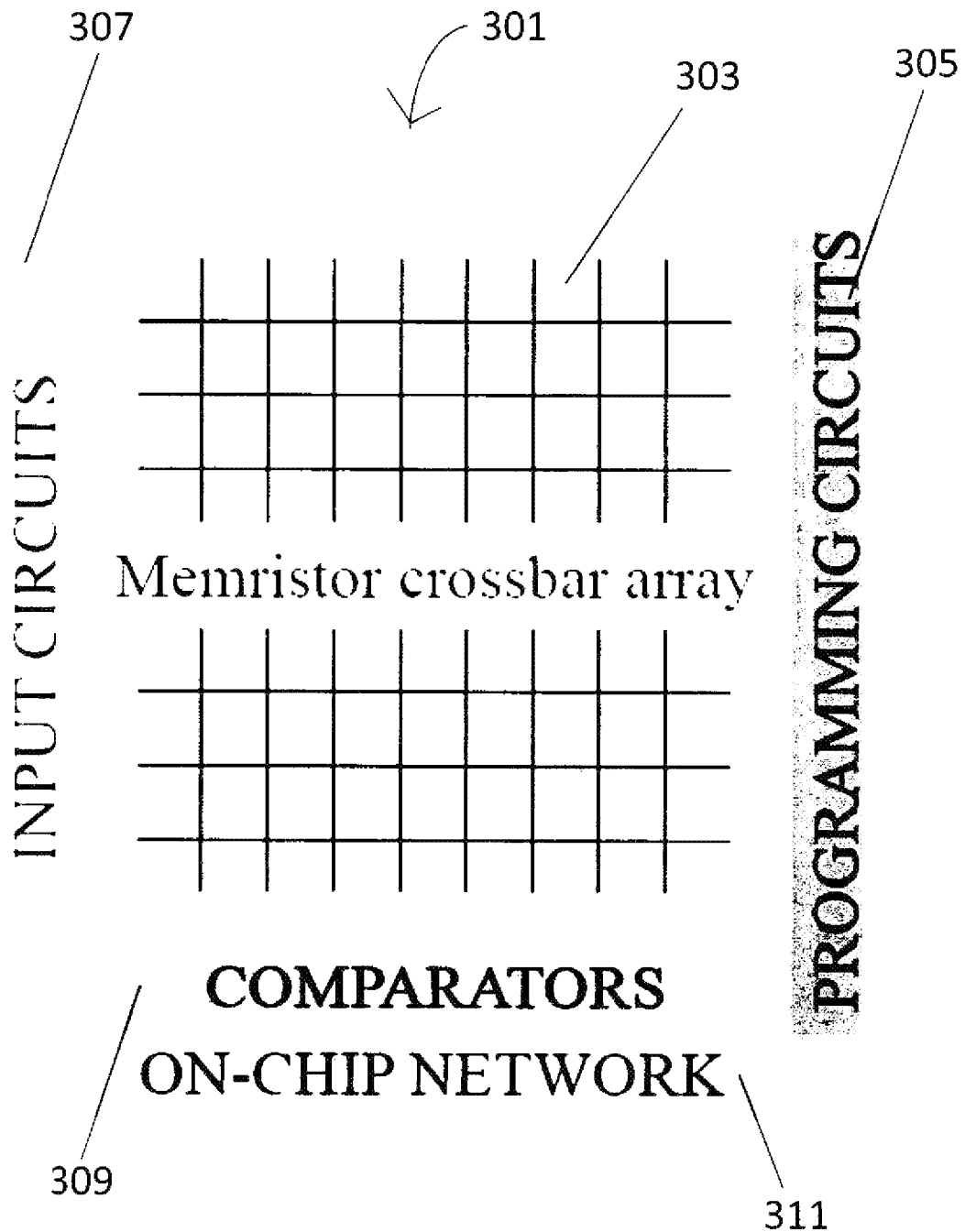
FIG. 2 is a block diagram of a neuromorphic processor architecture 301 in accordance with an embodiment of the present invention.

FIG. 2 is a block diagram of a neuromorphic processor architecture 301 in accordance with an embodiment of the present invention. This architecture 301 can incorporate on-chip learning to enable algorithm flexibility, and it incorporates 1 transistor, 1 memristor (1T1M) array cells to provide for more precise control of the memristor conductance values during programming using known programming circuits 305. Comparators 309 are used for the evaluation circuit to enable a digital communication network 311 and digital input circuits 307. This building block can be replicated multiple times to create a full chip version for large neural processing applications. Unless otherwise specified, the array is a 256×64 array; this refers to the number of inputs and neurons. The number of columns (128 in this case) may be twice that, in the event a differential current architecture is used. This array size may be fabricated using, e.g., 45 nm technology.

Memristor arrays implementing a threshold gate network (TGN) can be organized in multiple ways. Three approaches in particular are discussed below.

1. Single-Ended Voltage

Figure 3:
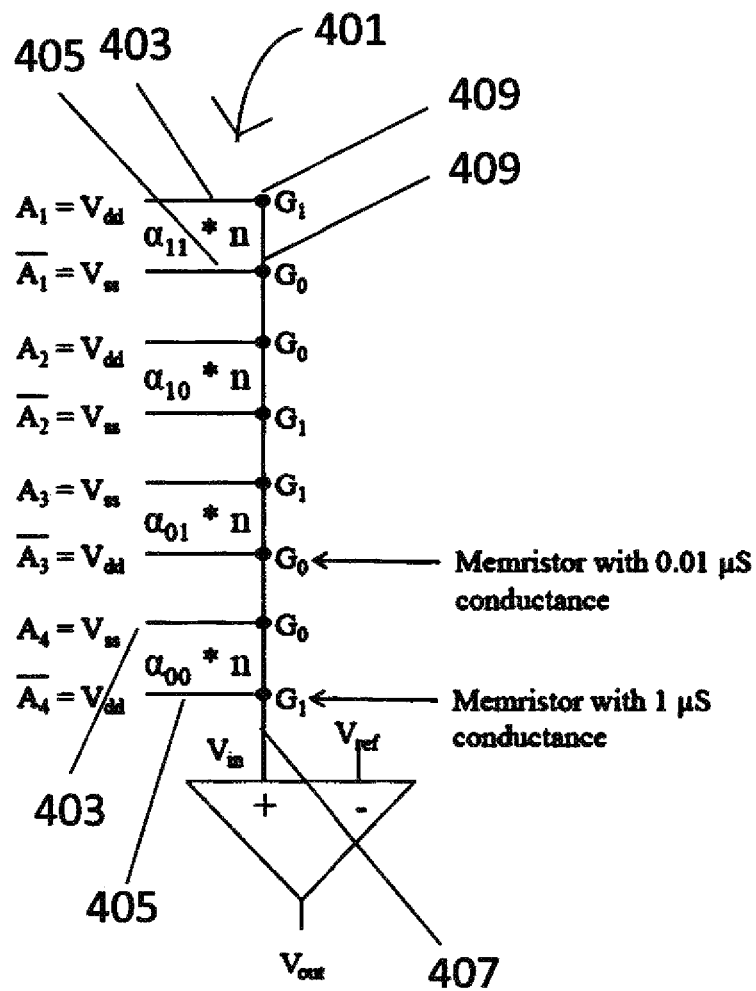
FIG. 3 is a diagram illustrating a single-ended voltage architecture.

FIG. 3 is an example of a single-ended voltage architecture (SV) 401. Every input 403 and its inverse 405, along with any bias inputs (not shown), is connected to a single voltage rail 407 through a memristor 409 (represented by the blue circle) with a specific programmed conductance. This architecture 401 has been used to design and analyze embedded neural network processors. $G_0$ represents an "off" state, or extremely low conductance, while $G_i$ represents an "on" state, or high conductance. A typical on/off ratio can be ≥100. In our TON, all the weights are integer values, which can be represented in this simplified. SV architecture as one or more inputs with each neuron weight $w_i = G_1$. For example, =2 can be represented by two inputs with $w_i = G_1$ (for some applications, over 90% of the weights may be −1, 0, or +1). This representation is used here merely to simplify the analysis. For the actual design a single memristor is programmed with a conductance value ($G_i$) that represents the desired weight for that particular input and neuron. The voltage $V_{in}$ is compared to a reference voltage with a differential voltage comparator to create the threshold gate. The circuit in FIG. 4 can represent any neuron and set of inputs in a TON by selecting the proper values for $\alpha_{11}$, $\alpha_{10}$, $\alpha_{01}$, and $\alpha_{00}$.

2. Differential Voltage

Figure 4:
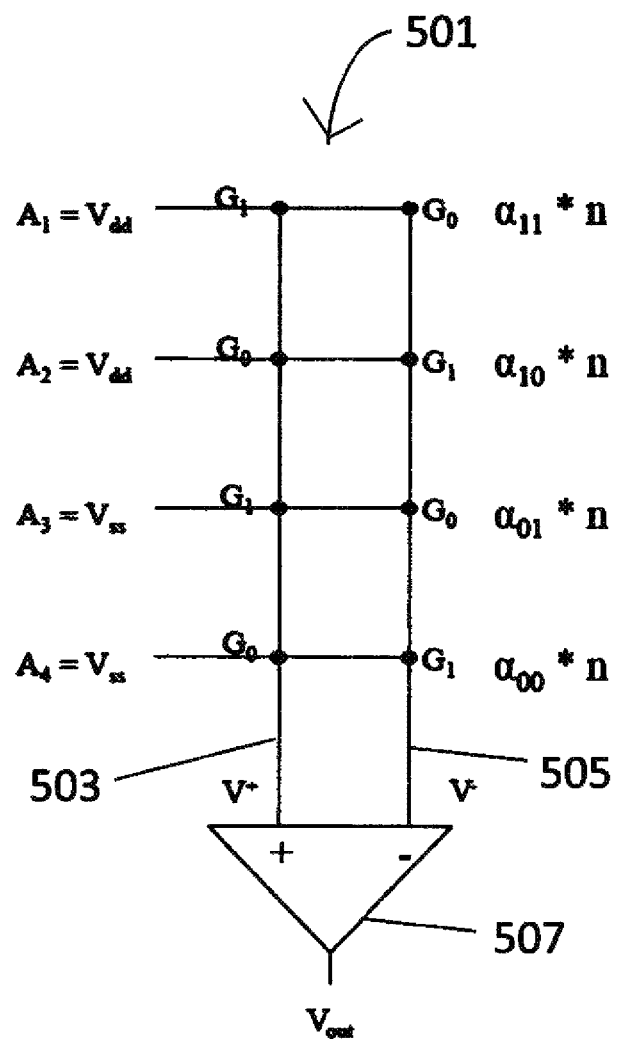
FIG. 4 is a diagram illustrating a differential-voltage architecture.

FIG. 4 is an example of a differential voltage architecture (DV) 501. Every input and bias is connected to both a positive voltage rail 503 and negative voltage rail 505 conductance. The equivalent circuits 511 for this architecture are shown. The two voltages are compared with a differential voltage comparator 507 to create the threshold gate.

A differential voltage architecture should also have improved common mode noise rejection. This indicates DV may provide benefits over SV in certain embodiments.

3. Differential Current with 1/High Z Inputs

Figure 5:
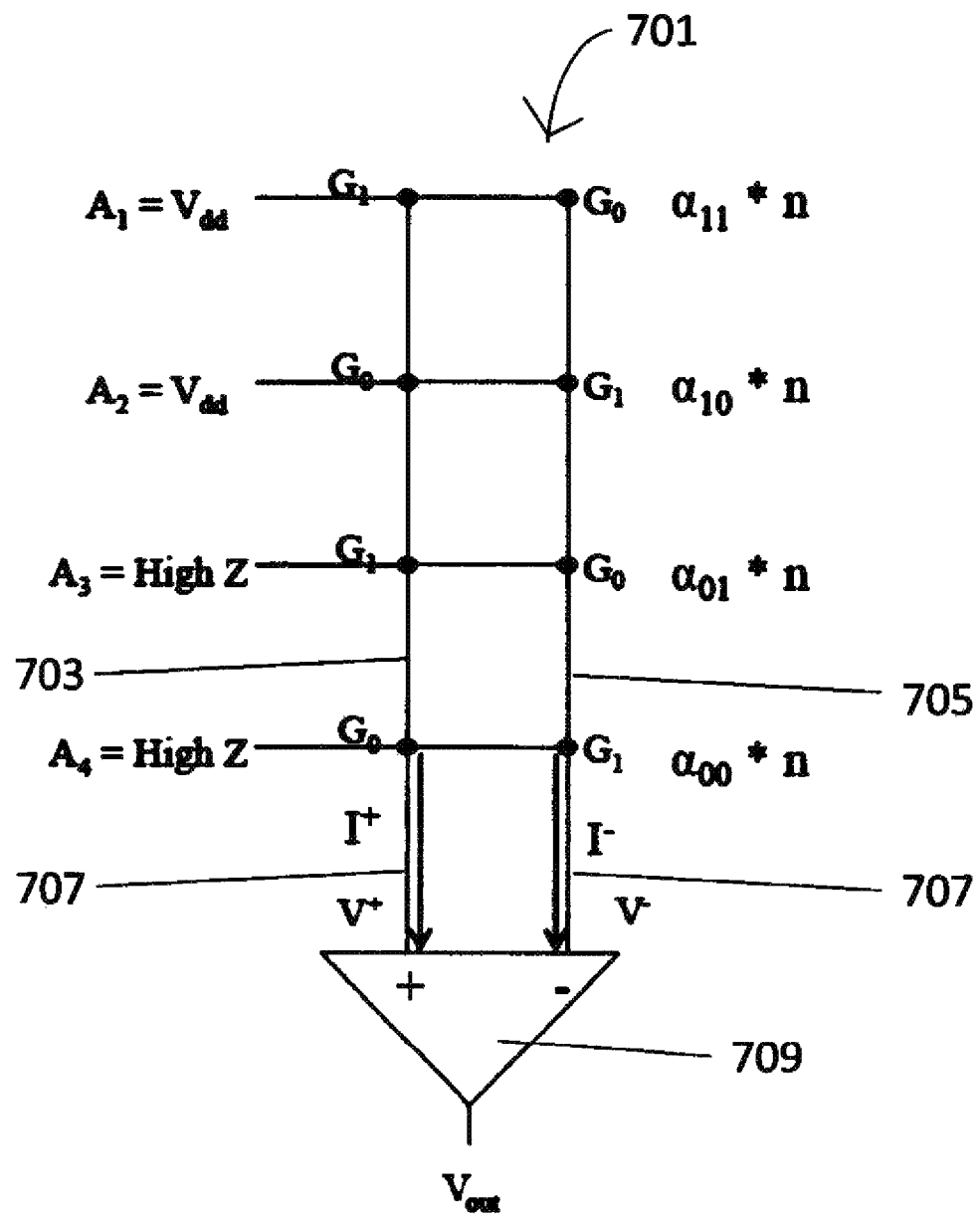
FIG. 5 is a diagram illustrating a differential-voltage architecture with high impedance.

FIG. 5 is an example of a differential current architecture 701 using 1/High Z inputs (DZ). When the input=0, the output of the row driver circuit is a high impedance node (High Z), rather than $V_{ss}$. Every input and bias is connected to both a positive rail 703 and negative rail 705 conductance. The outputs 707 are two currents, each summed separately on its own bit line. The two currents are compared using a differential current comparator 709 to create the threshold gate. Only input=1 conditions provide current (and consume power).

Circuit analysis indicates the 1/High Z differential current architecture (DZ) is power efficient compared to the SV and DV architectures. It also has a desirable property for circuit analysis: the current for each input is directly proportional to the weighted input for the neuron. This enables certain mathematical properties of the TGN to be verified as correctly implemented via simple analysis or simulation of the circuits.

Comparator Design

Figure 6:
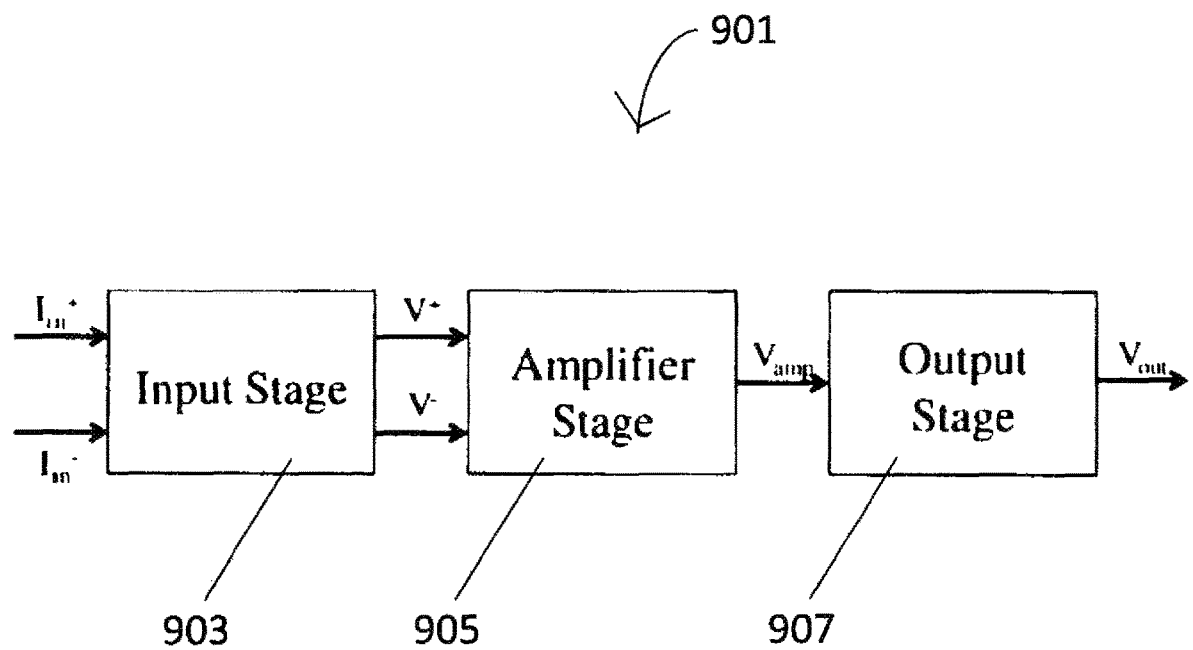
FIG. 6 is a block diagram of a comparator in accordance with an embodiment of the present invention.

The comparator is an important element of the architecture. The speed of this circuit is one of the main factors in estimating the neural network throughput (the router network is another important factor). Since the comparator sinks the currents from the array, it has to be large enough to handle the total current while still being able to discriminate a minimum difference ($\Delta G_{min}=1$ μS). This can have a major impact on the overall area and timing, and can limit the number of inputs allowed into a single neuron. It is also a significant consumer of the overall power. A comparator architecture 901 in accordance with an embodiment of the present invention is shown in FIG. 6. Two input currents enter an input stage 903, where they are transduced into differential voltages. The difference between these two voltages is amplified at an amplifier stage 905 to create an output, provided by an output stage 907, which can be buffered and latched for driving the data onto the communication network. The desired design will be compact, low power, and fast. If this can be achieved, a comparator circuit can be used for each neuron, instead of multiplexing as is often used. The inventor has developed an exemplary comparator that meets these specifications. For 45 nm processing technology, this comparator is compact (≈55 µm²), low power (~15 µW), and fast (≈250 MHz).

Comparator Architecture

Figure 7:
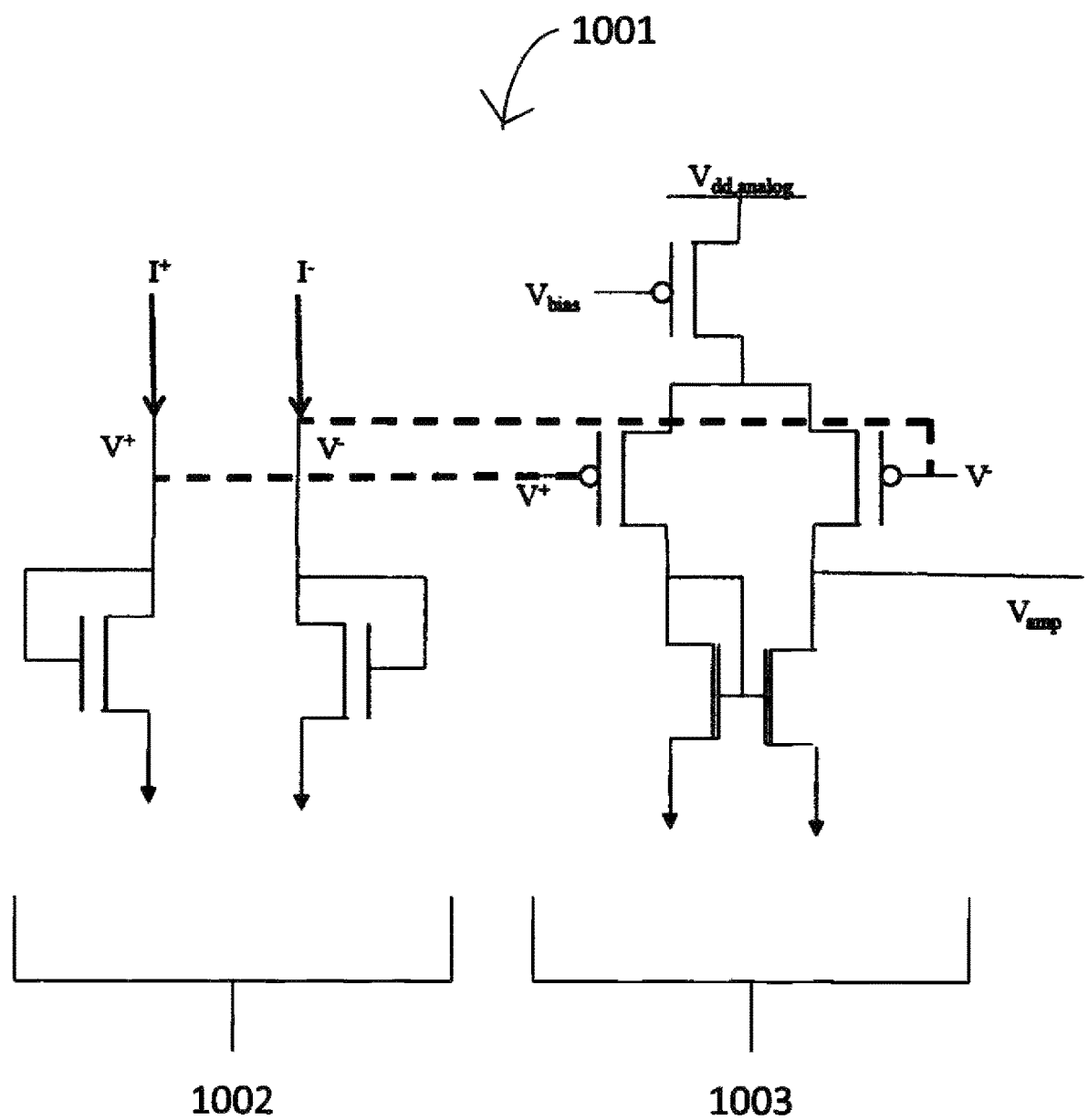
FIG. 7 is a simplified schematic of elements of a comparator in accordance with an embodiment of the present invention.

FIG. 7 provides a simplified schematic of elements of a comparator 1001 in accordance with an embodiment of the present invention. The input stage 1002 is built using an FET with drain and gate connected to create a diode-connected FET (one each for the positive and negative inputs). The amplifier stage 1003 uses simple 5 FET differential voltage amplifiers. Two amplifiers are used so that the output voltage of the amplifier stage is driven to ≈$V_{dd}$ or $V_{ss}$ as needed. The output stage (not shown) uses four inverters in series to drive the output load, which includes wire capacitance and the input gate of the router/switch. Data latching is enabled by the use of a controllable transmission gate between inverters 2 and 3.

For traditional applications this design would be impractical for at least two reasons:

1. The maximum current input and minimum current difference that can be sensed are inversely related, limiting the operating range of the design; and 2. The design is very sensitive to device mismatches (such as small $V_t$ differences).

In using the comparator for neural net applications, however, we can take advantage of some conditions that are not typically available.

1, The weights in the neural network must be programmed, and are therefore known in advance. For any given set of weights, the comparator needs to operate correctly in only a subset of the total range required.

2. The memristors are programmable conductance devices that can be used to ensure correct operation even under device mismatch conditions.

Figure 8:
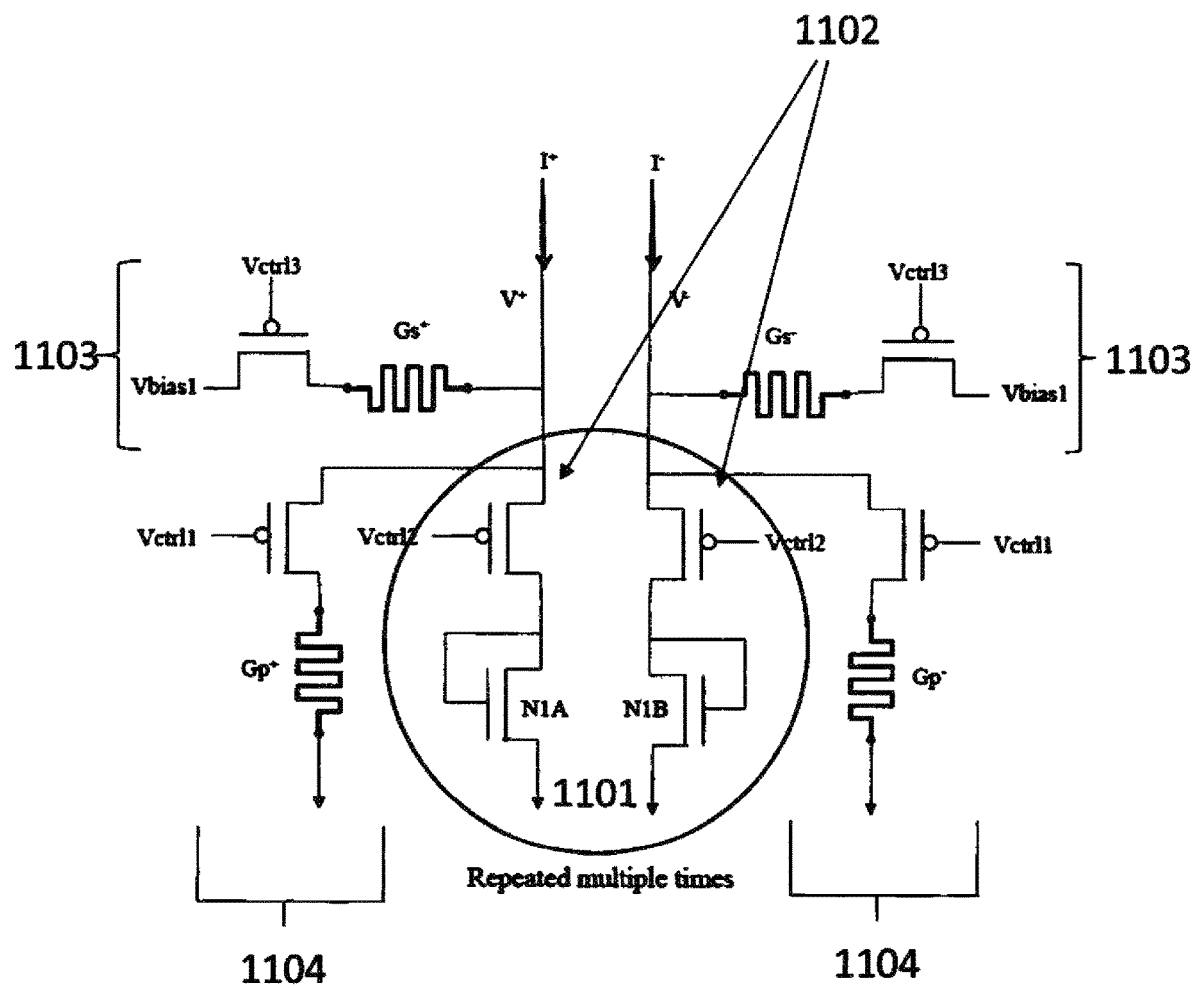
FIG. 8 is a schematic of an input stage of a comparator in accordance with an embodiment of the present invention.

We take advantage of this knowledge by modifying the base comparator design (see FIG. 8). The first modification is to modify the input circuits by using multiple diode-connected FETs 1101 in parallel for each of the two inputs. These parallel FETs have control gates 1102 that enable one or more diodes to be active, depending on the total weight for the neuron. The control PFETS have W/L 270/45 nm. The estimated voltage drop across these control PFETS will be <5 mV. The total weight (maximum possible conductance) is known in advance since the memristors need to be programmed. This enables a proper number of diodes to be activated, enabling the design to operate in its desired range under most input conditions. The second modification is to include additional 1T1M cells in the design. One set of two cells 1103 ($G_s^+$, $G_s^-$) is connected to the bit lines (like a bias or data input). The other set of two cells 1103 ($G_p^+$, $G_p^-$) is in parallel with the set of diodes. These memristors can be programmed in a manner similar to the network weights, and enable modification of the differential voltages ($V^+$, $V^-$) to compensate for device and parameter mismatches.

The series memristors have greater effect when $V^+$ (or $V^-$) is low; the parallel memristors have greater effect for higher $V^+$ (or $V^-$). The memristor values would most likely be found as part of a chip calibration procedure. This procedure would be done before setting the desired programming weights into the array, and uses a majority function for this purpose:

1. Set the weights to create equal numbers of +1 and −1 values, and set all inputs high.

Figure 9:
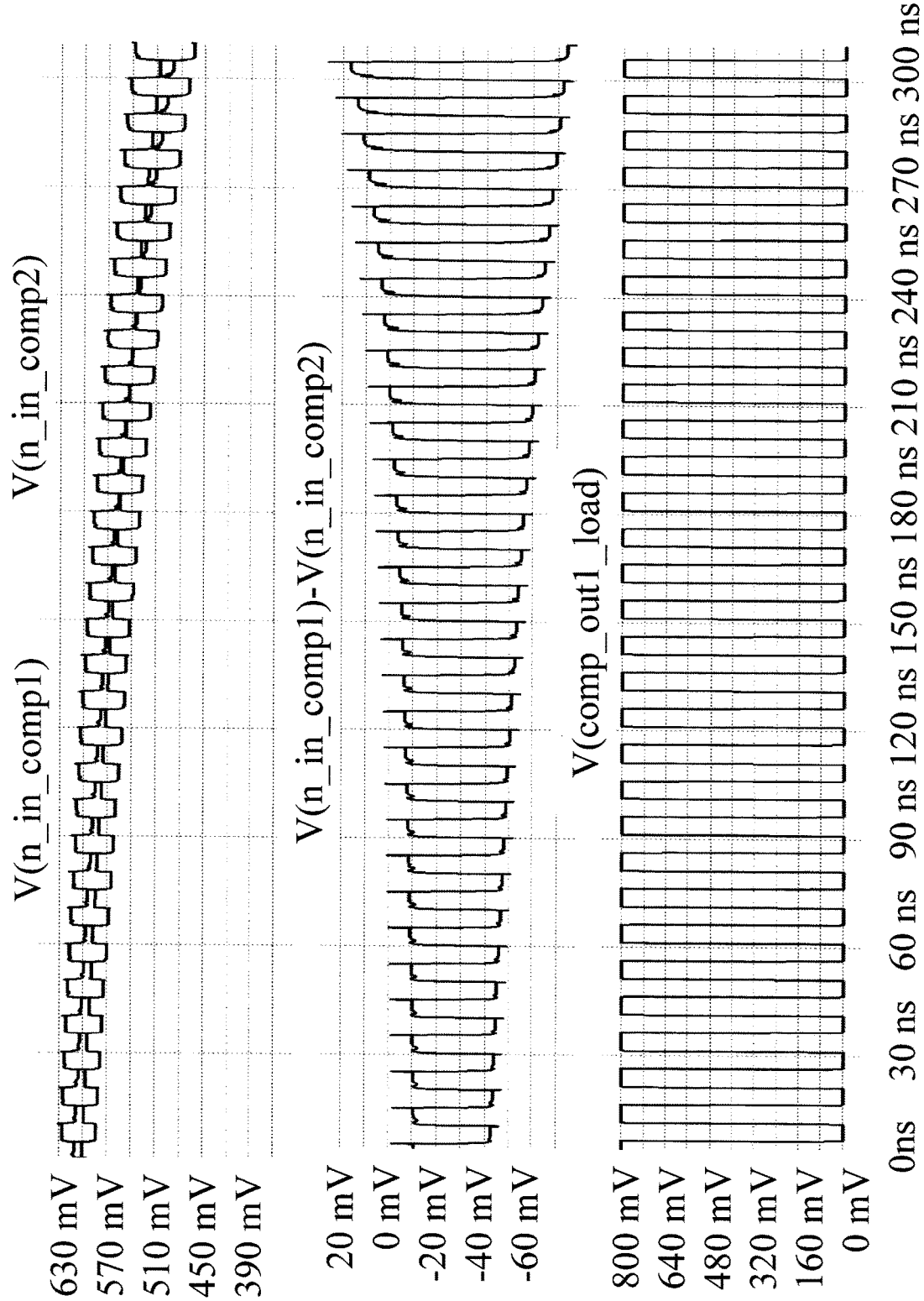
FIG. 9 is a graph of a simulation performed for a comparator incorporating the elements of FIG. 8.

2. During each major time interval, cycle one +1 weight, and then one −1 weight by turning the +1 input off, then on, simultaneously turning the −1 input on, then off (each for one clock cycle of 5 ns, giving a total time interval of 10 ns). FIG. 9 shows a simulation in which a time interval of 10 ns was used. The bottom plot is the comparator output, using a 5 ns clock. The output signals are 100% correct and very clean.

3. After this, reduce both the total positive and negative weights by 1 (or any other equal decrement).

4. Repeat until the "common mode" weight (i.e., the base number of negative and positive weights) is a minimum.

5. Based on the outputs, adjust the $G_p$ and $G_s$ devices as follows:

High common mode weights that create "0" errors require an increase in $G_p^+$, while low common mode weights that create "1" errors require an increase in $G_s^+$. $G_p^-$ and $G_s^-$ would be adjusted if the opposite conditions exist.

Repeat the procedure until acceptable operation is reached.

This procedure assigns a value of 1 to each correct output, −1 to each incorrect output, and adjusts the comparator bias memristors until the total value equals the number of outputs measured (fully correct functionality). This procedure can be modified in many ways. For example, heavier emphasis can be given to getting correct values for high total conductance values and ignoring incorrect values at very low conductance values (or specific biases can be used to ensure extremely low conductance levels are never seen). Other optimizing algorithms can be used as desired. Using 45 nm design technology, simulations have shown that up to ±10 mV (20 mV total) $V_t$ mismatch and up to ±5 nm (10 nm total) dimensional mismatch can be tolerated between the critical pairs of devices in this differential design (N1A and N1B in the input stage in FIG. 11, and the input FETs for the amplifiers). An example simulation for this level of mismatch is shown in FIG. 9. The top plot shows $V^+$ and $V^-$, while the middle plot is the differential voltage ($\Delta V_{diode} = V^+ - V^-$). The differential voltage is almost always negative here. Without the additional 1T1M cells, a comparator with these levels of mismatch would almost always be incorrect. With the addition of the 1T1M cells and the procedure, the comparator output can still be 100% correct.

Figure 10:
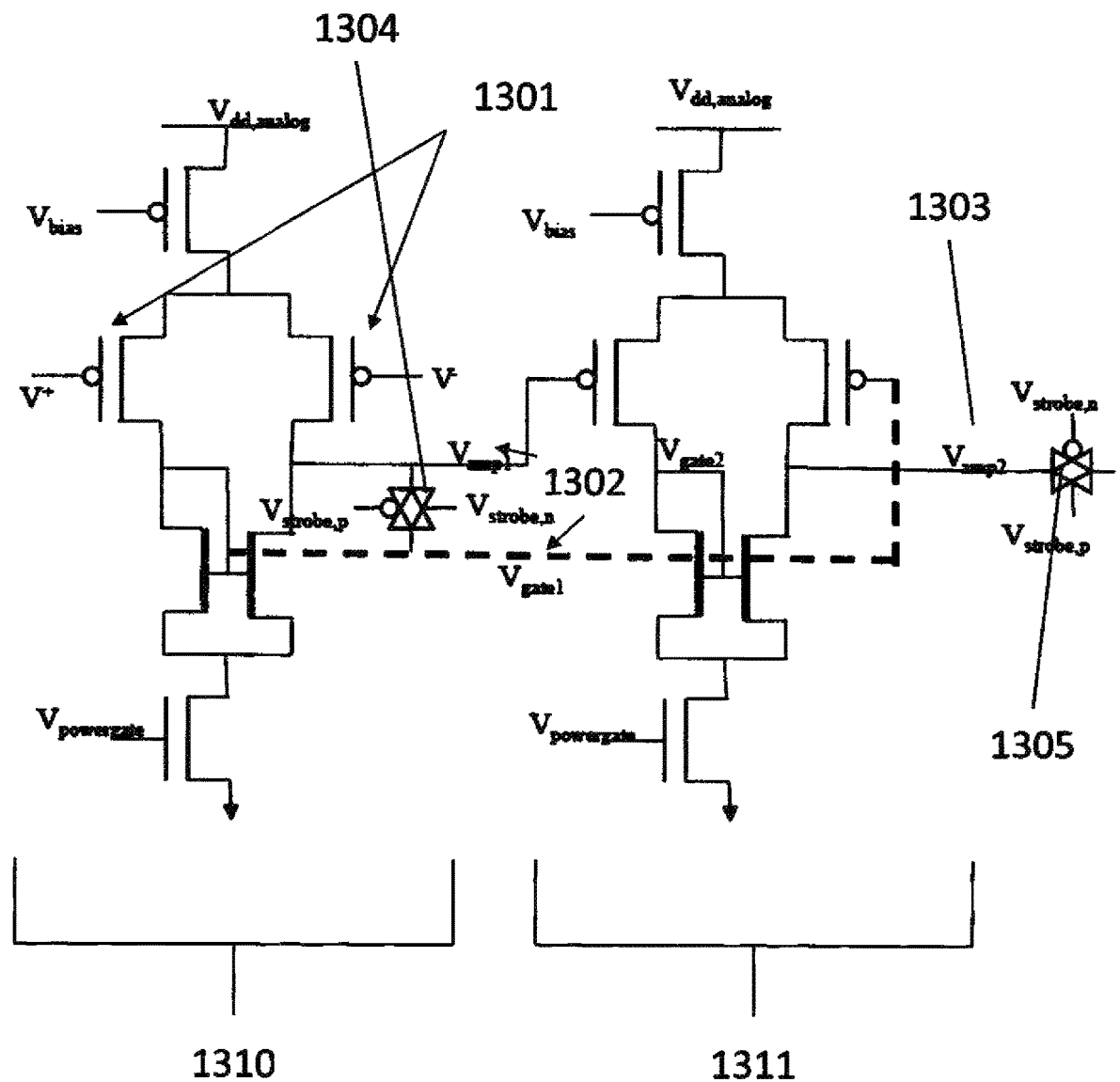
FIG. 10 is a schematic of elements of an amplifier stage of a comparator in accordance with an embodiment of the present invention.

Another design modification used to improve the comparator performance is illustrated in FIG. 10. As the two currents t and flow into the diode, they set the diode voltages 1301 ($V^+$ and $V^-$). The small difference in the currents caused by the differing weighted sums creates a small voltage difference. This differential voltage is amplified by amplifier 1310 to create a much larger voltage difference between $V_{gate1}$ 1302 and $V_{amp1}$ ($V_{gate1}$ stays relatively constant, while $V_{amp1}$ swings over a large range). The second amplifier 1311 is used to drive its output 1303 ($V_{amp2}$) nearly to $V_{dd}$ or $V_{ss}$. The speed of this basic design is mainly dependent on the first amplifier, and is primarily determined by two factors:

1. How fast can the bias current change $V_{amp1}$?
2. How much does the bias current need to change $V_{amp1}$?

Figure 11:
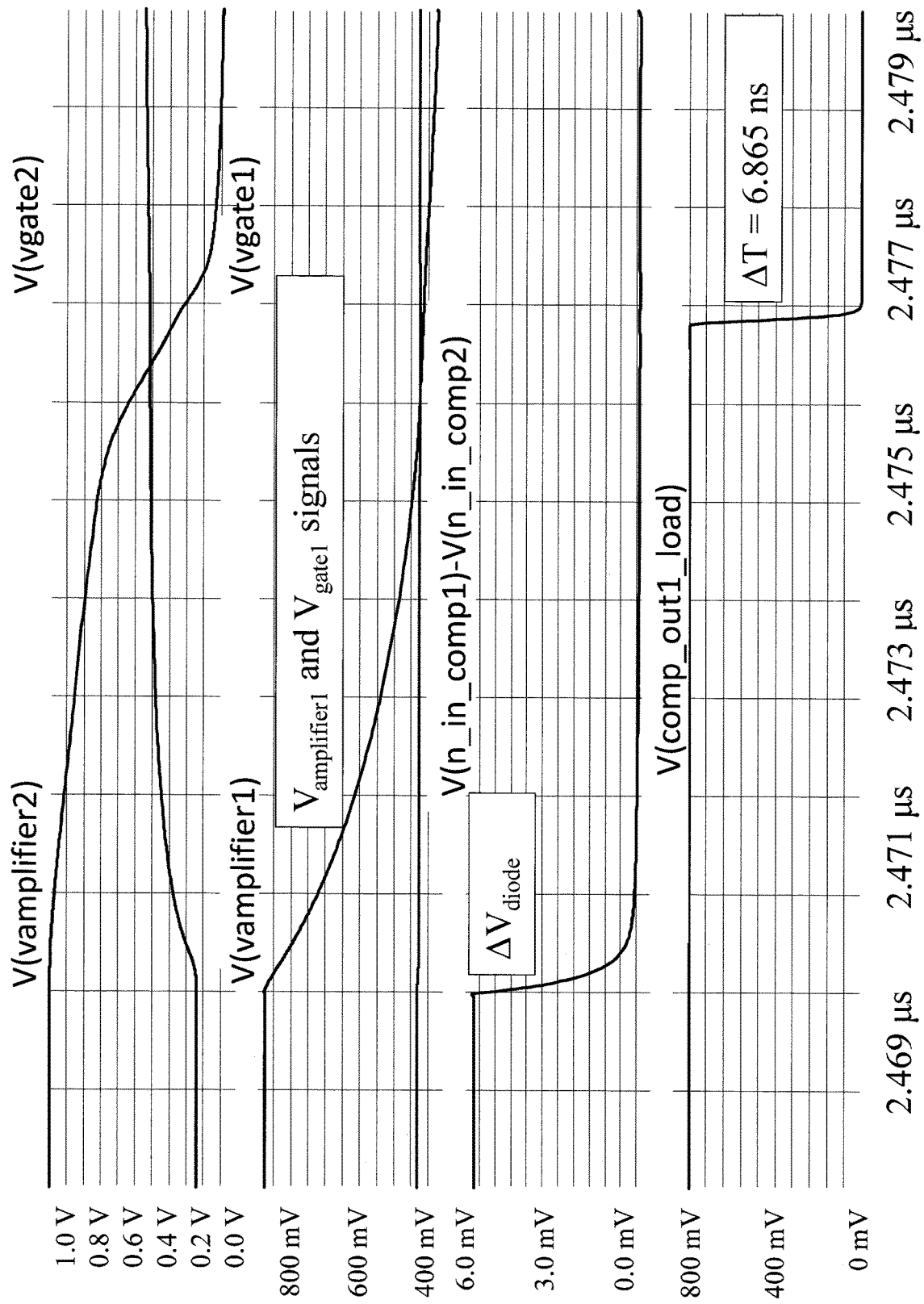
FIGS. 11 and 12 are timing simulations illustrating operation of comparators according to embodiments of the present invention.
Figure 12:
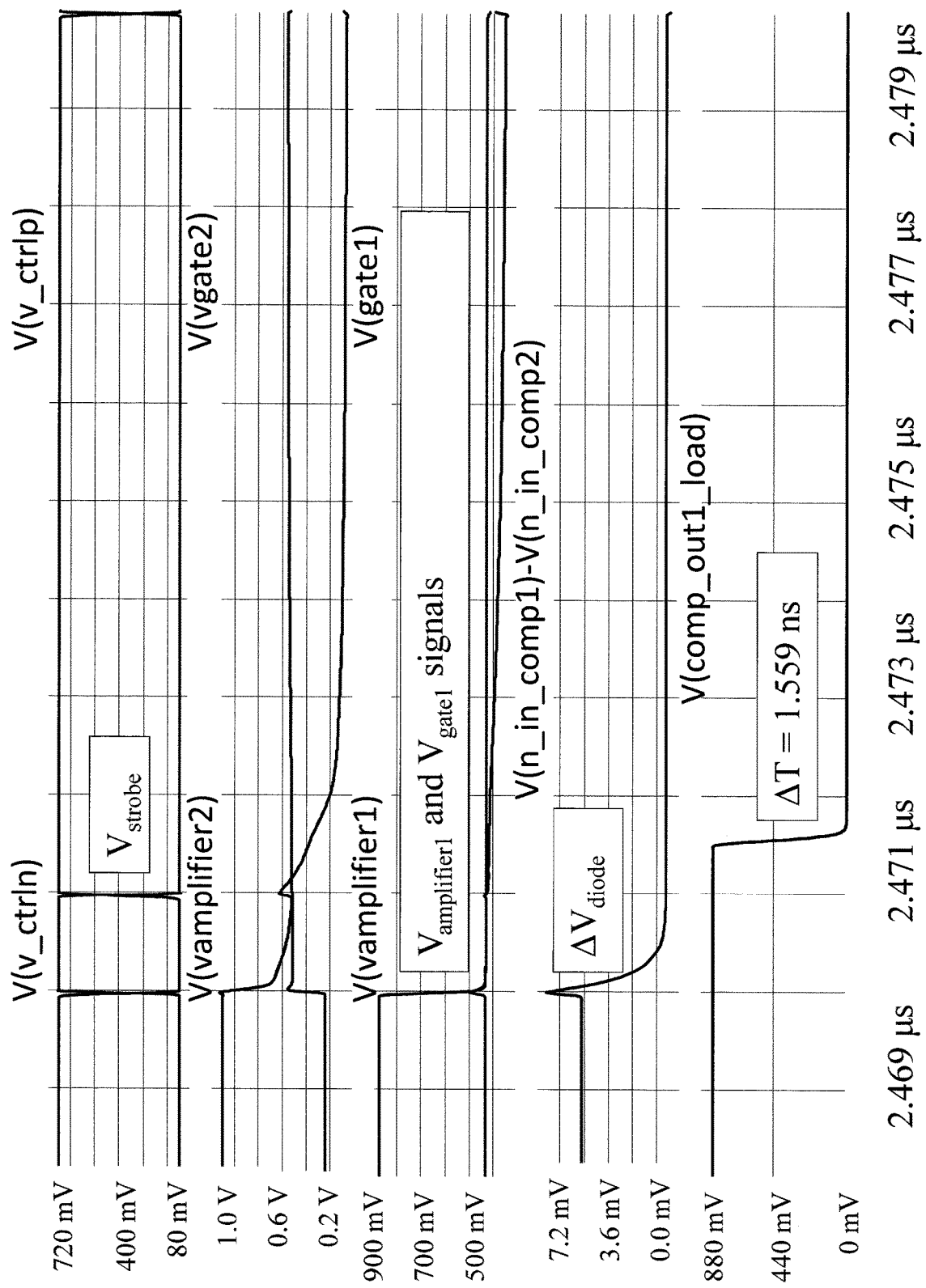

This can be expressed using the fact that $V_{amp1}$ has a node capacitance, and therefore $I = C * \Delta V / \Delta t$ or $\Delta t = C * \Delta V / I$ To reduce $\Delta t$, you can increase I or reduce $\Delta V$. The first factor is essentially a design optimization: higher bias currents can swing the output faster, but take more power and create a larger design (increased capacitance) that will slow down the amplifier. Larger amplifier input transistors will also slow down the rate at which the diode can swing the input voltages, but that is a smaller, secondary influence. The second factor is input dependent. In a situation where the previous weighted sum is highly negative and the current weighted sum=+1 (or where the previous sum is highly positive and the current sum=−1), the $\Delta V_{amp1}$ value is very high, and the final $V_{amp1}$ voltage will be very close to $V_{gate1}$. The bias current will take a relatively long time $\Delta t$ to switch $V_{amp1}$ past $V_{gate1}$. Only then will the second amplifier switch as well. The second factor however, can be managed by the architecture. FIG. 10 depicts the changes to the amplifier architecture, and FIGS. 11 and 12 are timing simulations that display the effect of these changes.

By adding a transmission gate connecting $V_{amp1}$ to $V_{gate1}$ 1304, we can controllably force $V_{amp1}$ to be very close to $V_{gate1}$. $\Delta V_{amp1}$ will be very small (and relatively constant under all input conditions). This is done by using a strobe signal that turns this T-gate on during the early part of the comparison operation, and turning it off during the later part. The diodes are always on. While this T-gate is on, a second T-gate 1305 (connected to $V_{amp2}$) is turned off, and the T-gate in the output driver (not shown) is turned on, which keeps the previous output valid and avoids $V_{out}$ glitching. The T-gates are turned off (or on, respectively) during the later portion of the comparison operation. The simulations in FIGS. 11 and 12 are for the same array and inputs, with equal time scales. The comparator in the first plot (FIG. 11) does not have the T-gate/Tstrobe feature. Since the previous sum value is very positive ($\Delta V_{diode} \approx 6.0$ mV). $V_{amp1}$ must swing very far (from 900 mV to 400 mV) to cross $V_{gate1}$. This takes a long time, making $\Delta T$ large (6.865 ns). In the second plot (FIG. 12), the comparator with the T-gate/$T_{strobe}$ included drives $V_{amp1}$ to drop very close to $V_{gate1}$ almost instantly. This greatly reduces the delay ($\Delta T$=1.559 ns).

Figure 13:
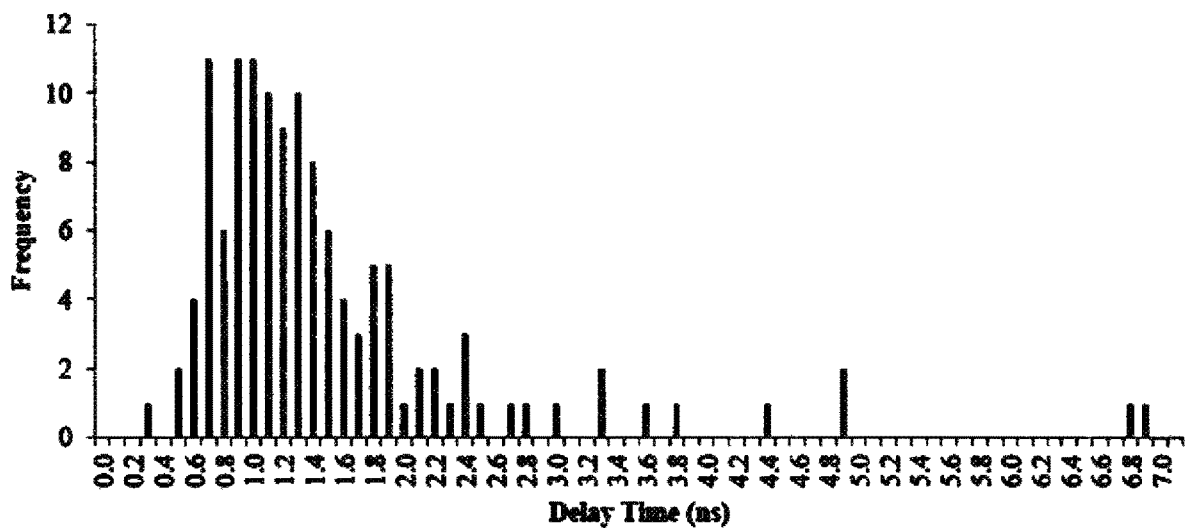
FIGS. 13-15 are graphs of output delay times for comparators according to embodiments of the present invention.
Figure 14:
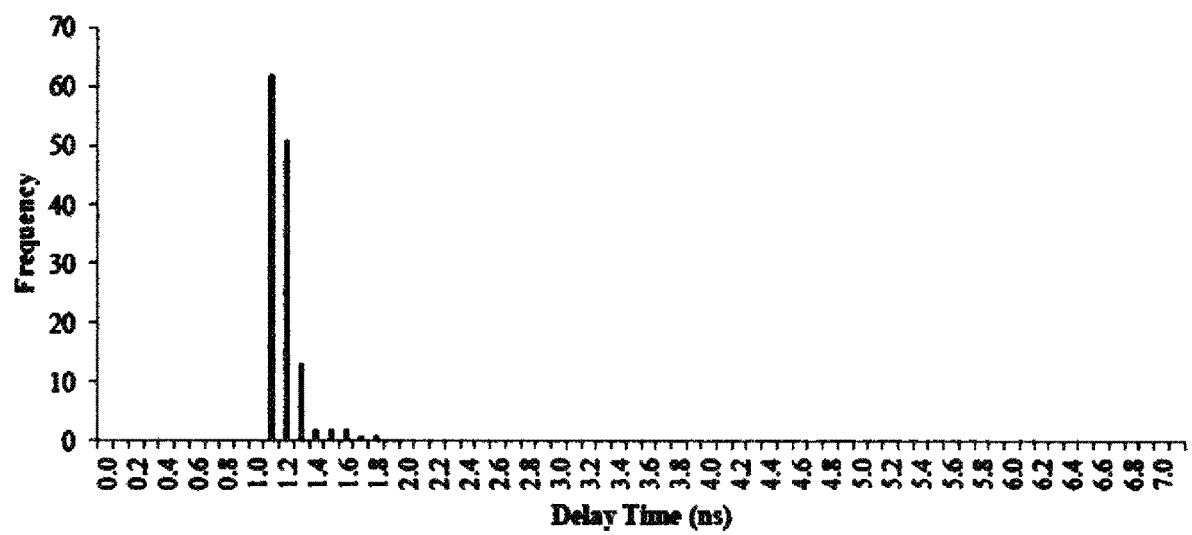
Figure 15:
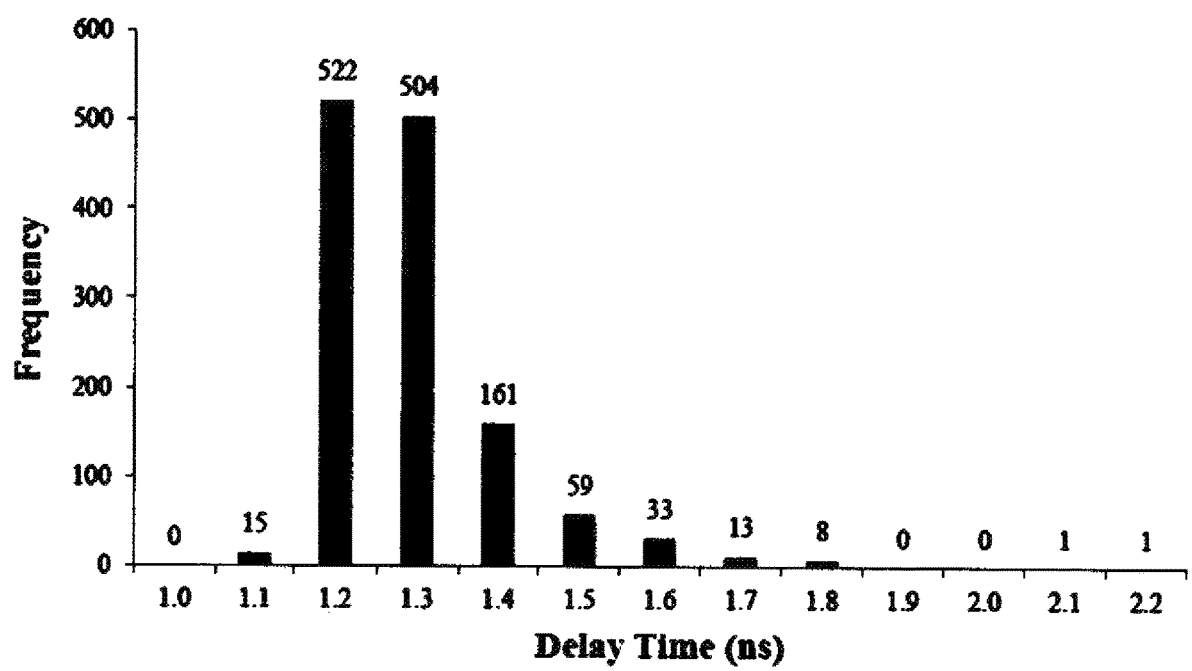

FIGS. 13-15 show how this affects the comparator speed. Without the T-gates (FIG. 13), the speed is dependent on both the previous inputs and the current inputs. With the new architecture (FIGS. 14 and 15), $V_{amp1}$ always starts very close to $V_{gate1}$ and the worst case time delay is drastically reduced. The comparator speed is now relatively independent of the inputs. The $T_{strobe}$ time does increase the comparator delay for very fast transitions, but these do not define the comparator speed. $T_{strobe}$=1 ns appears to provide the best balance.

Figure 16:
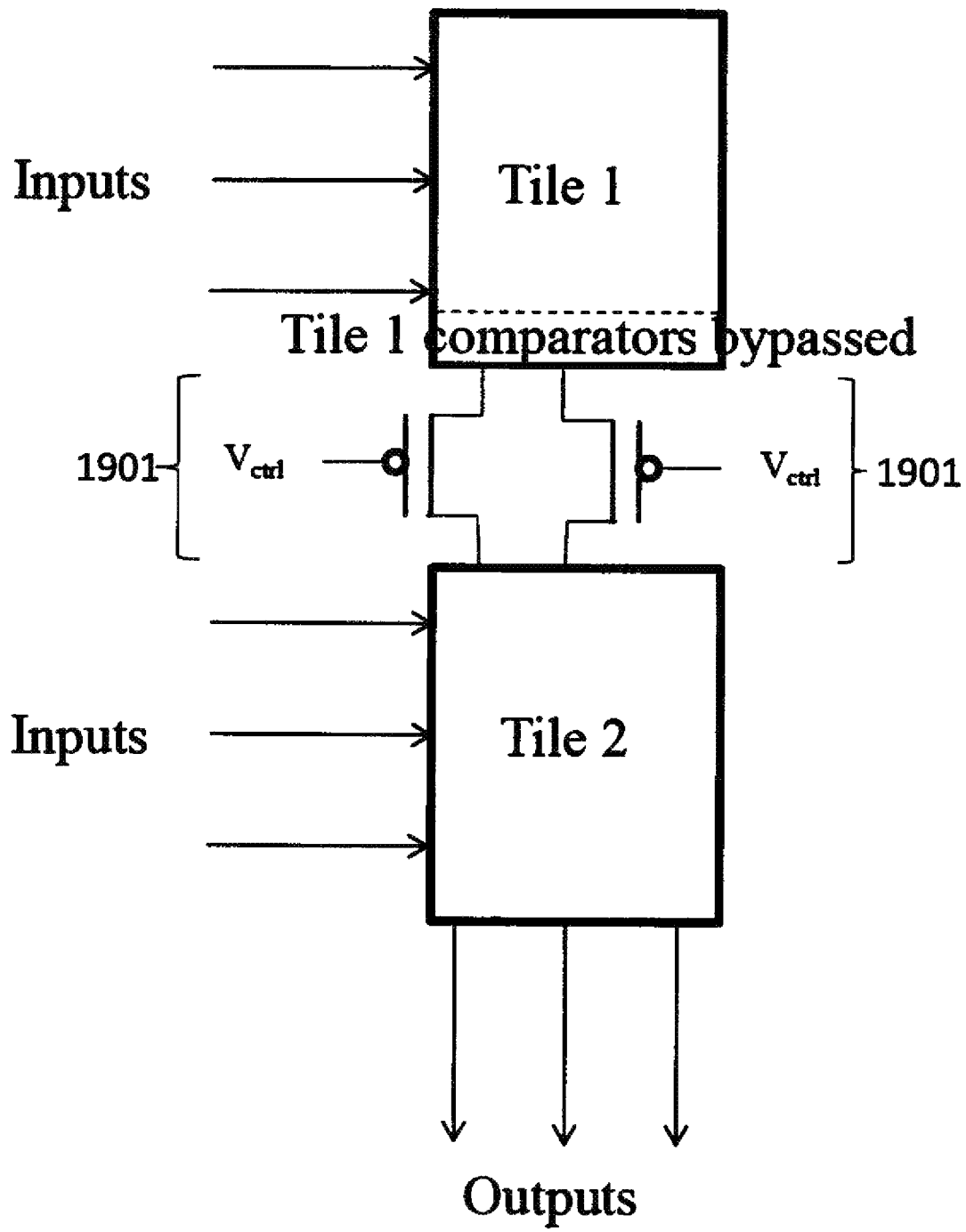
FIGS. 16 and 17 are diagrams illustrating tile architectures according to embodiments of the present invention.
Figure 17:
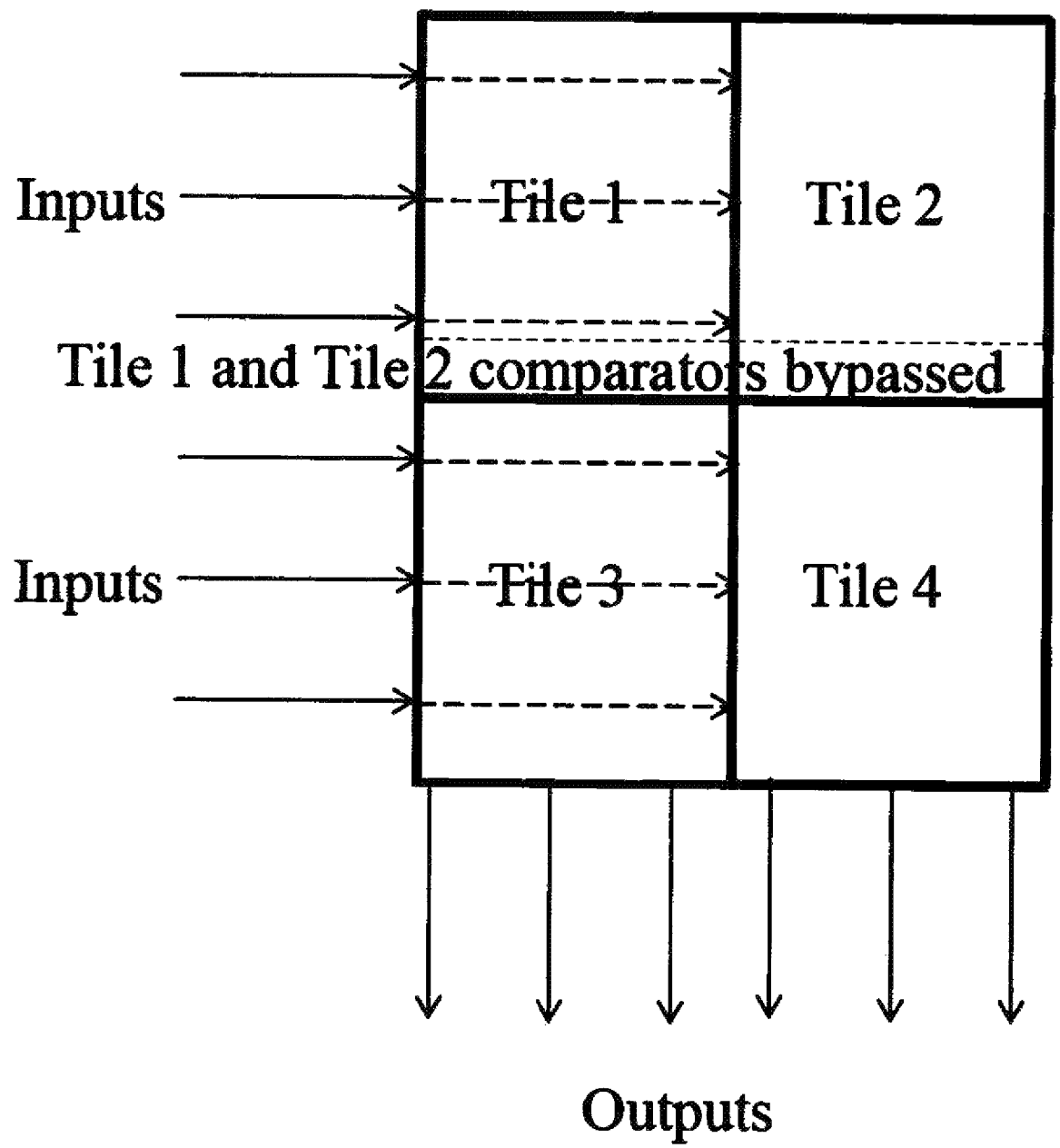

The use of the 1/High Z differential current architecture (DZ), and the comparator design described above, enables an important architectural option, which we call a tile. One of the major difficulties in trying to design a general purpose neural processor is that the desired array sizes span a wide range. Just to use a few exemplary applications in the realm of neuromorphic computing (these applications are described, e.g., in D. J. Mountain, "A general purpose neural processor," dissertation, University of Maryland, Baltimore County, 2017), the MNIST application maps well to 256×64 arrays, the CSlite decoder stage naturally fits into an 8×256 array, the CSlite detector stage has one layer in the network that requires 512×32 arrays (less than 512 inputs could not be mapped), and the AES-256 State Machine would prefer a 16×16 array mapping. Finding a single array size that can efficiently map all of these is a daunting task. The availability of tiles makes it more practical. The DZ architecture and our comparator allow for the use of control FETs to divert the differential current to specific diodes at the input stage of the comparator. This means that we can add one set of two additional control FETs per comparator 1901 (per neuron) that enable the current to be passed to a comparator in a different array. Keep in mind that the current being passed represents the weighted sum of the inputs. Therefore the function of the neural net is maintained. The second array is evaluating its inputs plus the inputs from the first array. The two arrays are then combined into a single neuron (or set of neurons). This concept is illustrated in FIG. 16. This feature means that smaller arrays (tiles) can be connected to form much larger arrays. For example, four 64×16 tiles can be connected together to make a 128×32 array (see FIG. 17). Here the inputs go into Tile 1 and Tile 3; they are also sent across to Tile 2 and Tile 4. The comparators in Tile 1 and Tile 2 are shut down, and the current (the sum of the weighted inputs) is passed to the comparators in Tile 3 and Tile 4, which now sum up all of the weighted inputs to create the final outputs.

The design optimization is now to find the optimum tile size, not the optimum array size. This new architectural option also greatly expands the set of possible solutions. Without this, no array smaller than 512 inputs could have been used for the general purpose neural processor design for the applications discussed above. Instead, tiles that are very small (8×2 or 16×1, for example) are possible solutions.

The tile concept is further enhanced by the ability to control the current (and therefore the power) in the unused portions of the tile (unit cells, comparators). Simulations of a 256×32 array show that the active power can be completely eliminated. The leakage power is an extremely small fraction (much less than 1%) of the total. The input circuits may need to send the input value across a tile to a neighboring tile, through another driver/latch circuit. This adds a small delay ($\approx$30 ps per tile). As long as the number of horizontal tiles connected is reasonable (10 or less), the effect on performance is small.

Another point to be made is that the control PFETs added to the comparator design need to pass a large amount of current, and are therefore large (W/L=1200/45 nm). This keeps the $\Delta V_{ds}$ below 3 mV. This adds about 1.9 $\mu m^2$ in area to the comparator. A more important issue is that all the tiles need to have comparators, which are relatively large. This is because a tile needs to be an array itself, not just part of a larger array. The compact low power comparator design disclosed herein makes this practical.

While the above description has shown, described, and pointed out novel features as applied to various embodiments, it will be understood that various omissions, substitutions, and changes in the form and details of the devices or algorithms illustrated can be made without departing from the spirit of the disclosure. As will be recognized, certain embodiments described herein can be embodied within a form that may not provide all of the features and benefits set forth herein, as some features can be used or practiced separately from others. The scope of the invention is indicated by the appended claims rather than the foregoing description. All changes which come within the meaning and range of equivalency of the claims are to be embraced within their scope.

I claim:

1. A computer processor comprising:
an on-chip network; and
a plurality of tiles, each tile comprising:
  at least one input circuit configured to receive at least one voltage signal provided by the on-chip network;
  a crossbar array, comprising:
    at least one neuron, comprising:
      a first bit line;

a programmable-resistor connecting the voltage signal to the bit line;

a second bit line; and a comparator configured to receive inputs from the two bit lines and to output a voltage Vout, in the event a bypass condition is not active;

a programming circuit configured to set a resistance value of the programmable resistor;

a pass-through circuit configured to provide the voltage signal to at least one input circuit of a first additional tile in the processor, in the event a pass-through condition is active;

a bypass circuit configured to provide values of the bit lines to a second additional tile in the processor, in the event the bypass condition is active; and at least one output circuit configured to provide an output signal to the on-chip network.

2. A computer processor in accordance with claim 1, wherein:

the at least one neuron further comprises a programmable resistor connecting the voltage signal to the second bit line; and the programming circuit is further configured to set a resistance value of the programmable resistor connecting the voltage signal to the second bit line.

3. A computer processor in accordance with claim 1, wherein the first additional tile in the processor and the second additional tile in the processor are different tiles.

4. A computer processor in accordance with claim 1, wherein the first additional tile in the processor and the second additional tile in the processor are the same tile.

* * * * *